United States Patent [19]
Blaauw et al.

[11] Patent Number: 5,956,261
[45] Date of Patent: Sep. 21, 1999

[54] IN-TRANSIT MESSAGE DETECTION FOR GLOBAL VIRTUAL TIME CALCULATION IN PARRALLEL TIME WARP SIMULATION

[75] Inventors: David T. Blaauw; Nimish S. Radia, both of Austin, Tex.; Joseph F. Skovira, Oswego, N.Y.

[73] Assignee: International Business Machines Corporation, Armond, N.Y.

[21] Appl. No.: 08/816,589

[22] Filed: Mar. 13, 1997

[51] Int. Cl.$^6$ .................................................. G06F 9/455

[52] U.S. Cl. .......................... 364/578; 395/500; 395/874; 395/876

[58] Field of Search ..................................... 364/578, 131, 364/488, 489, 490; 371/22.3; 395/500, 841, 872, 874, 876; 711/141, 144

[56] References Cited

U.S. PATENT DOCUMENTS

| | | | |
|---|---|---|---|
| 5,095,454 | 3/1992 | Huang | 364/578 |
| 5,142,533 | 8/1992 | Crisler et al. | 370/95.1 |
| 5,193,151 | 3/1993 | Jain | 395/200 |
| 5,250,943 | 10/1993 | Childs et al. | 340/825.8 |
| 5,299,137 | 3/1994 | Kingsley | 364/489 |
| 5,327,361 | 7/1994 | Long et al. | 364/578 |
| 5,408,506 | 4/1995 | Mincher et al. | 375/356 |
| 5,442,772 | 8/1995 | Childs et al. | 395/500 |
| 5,479,414 | 12/1995 | Keller et al. | 371/22.3 |
| 5,715,184 | 2/1998 | Tyler et al. | 364/578 |
| 5,721,953 | 2/1998 | Fogg, Jr. et al. | 395/841 |
| 5,784,591 | 7/1998 | Kageshima | 395/500 |
| 5,794,005 | 8/1998 | Steinman | 395/500 |
| 5,801,938 | 9/1998 | Kalantery | 364/131 |

FOREIGN PATENT DOCUMENTS

| | | |
|---|---|---|
| 2048140 | 1/1993 | Canada . |
| 6-44161 | 2/1994 | Japan . |
| 1354203 | 11/1987 | U.S.S.R. . |

OTHER PUBLICATIONS

P. Heidelberger, et al. "Parallel Simulation of Continuous Time Markov Chains Using Uniformization with Adaptive Rates", *IBM Technical Disclosure Bulletin*, vol. 36, No. 7, Jul. 1993, pp. 15–18.

B. R. Stanisic. "VHDL Modeling of Transmission Line Effects in Hardware Designs," *IBM Technical Disclosure Bulletin*, No. 7, Dec. 1990, pp. 277–285.

S. K. Das, et al. "Fast, Accurate Metric in Time Warping, Dynamic Programming Recognizers", *IBM Technical Disclosure Bulletin*, Feb. 1978, pp. 3804–3805.

Heidelberger, et al. "Optimistic Parallel Simulation of Continuous Time Markov Chains Using Uniformization," *IBM Technical Disclosure Bulletin*, No. 3, Aug. 1991, pp. 177–181.

Y. Lin, et al. "Determining the Global Virtual Time in a Distributed Simulation", 1990 International Conference on Parallel Processing, pp. III–201 to III–209.

(List continued on next page.)

*Primary Examiner*—Kevin J. Teska
*Assistant Examiner*—Russell W. Frejd
*Attorney, Agent, or Firm*—Shelley M Beckstrand

[57] ABSTRACT

System and method for calculating global virtual time for use in memory management, termination detection, snapshots, crash recovery, input and output handling, and so forth, and in parallel simulation of digital circuits. Processes executing on parallel processors communicate messages through channels having output trail buffers on each process communicating to the channel, and one input trail buffer for all processes receiving messages from the channel. A channel is the union of all wires or communication paths connecting two processors. Input trail buffers store the time stamp of the most recently received message, and output trail buffers store valley messages. Global virtual time is calculated with reference to the least time stamp of the output trail buffers, where the least time stamp is calculated with respect to the time stamp of the input trail buffer.

4 Claims, 5 Drawing Sheets

OTHER PUBLICATIONS

D. R. Jefferson. "Virtual Time", *ACM Transactions on Programming Languages and Systems,* vol. 7, No. 3, Jul. 1985, pp. 404–425.

G. Varghese, et al. "Deriving global virtual time algorithms from conservative simulation protocols", IN *Inf. Process. Lett.,* vol. 54, No. 2, Apr. 28, 1995, pp. 121–126; INSPEC abstract AN 4948338.

S. K. Das, et al. "A hypercube algorithm for GVT computation and its application in optimistic parallel simulation", IN Proc. of the 28th Annual Simulation Symposium, IEEE Comput. Soc. Press, xii+351, pp. 50–160, 1995; INSPEC abstract AN 4940244.

G. Varghese, et al. "The pessimism behind optimistic simulation", IN Proceedings of the 1994 Workshop on Parallel and Distributed Simulation, IEEE Cat. No. 94TH0677–5, Jul. 1994; INSPEC abstract, AN 4750727.

L. M. D'Souza, et al. "pGVT: an algorithm for accurate GVT estimation", IN Proceedings of 8th Workshop on Parallel and Distributed Simulation, Edinburgh, UK Jul. 1994; INSPEC abstract, AN 4750724.

K. Ghosh, et al. "PORTS: a parallel, optimistic, real–time simulator", IN Proceedings of 8th Workshop on Parallel and Distributed Simulation, Edinburg, UK, Jul. 1994; INSPEC abstract AN 4750714.

S. Srinivasan, et al. "Non–interfering GVT computation via asynchronous global reductions", IN IEEE 1993 Winter Simulation Conference Proceedings, vol. xxvii, 1993, pp. 740–749; INSPEC abstract AN 4744646.

D. K. Arvind, et al (editors). Proceedings of 8th Workshop on Parallel and Distributed Simulation, Edinburg, UK, Jul. 1994; INSPEC abstract AN 4740772.

Y. Lin. "Determining the global progress of parallel simultion", IN *J. Inf. Sci. Eng.,* Taiwan, vol. 9, No. 3, Sep. 1993, pp. 379–393; INSPEC abstract AN 4719952.

H. K. Kim, et al. "Parallel logic simulation using Time Warp on shared–memory multiprocessors", IN Proceedings of 8th Int'l Parallel Processing Symposium, Cancun, Mexico, Apr. 1994; INSPEC abstract AN4695927.

Y. Lin. "Determining the global progress of parallel simulation with FIFO communication property", IN *Inf. Process. Lett.,* Netherlands, vol. 50, No. 1, Apr. 1994, pp. 13–17; INSPEC abstract AN 4667115.

A. I. Tomlinson, et al. "An algorithm for minimally latent global virtual time," IN 7th Workshop on Parallel and Distributed Simulation (PADS '93), San Diego, CA, May 1993; INSPEC abstract AN 4664604.

H. Bauer, et al. "Distributed logic simulation and an approach to asynchronous GVT–calculation," IN Proceedings of the 1992 SCS Western Simulation MultiConference on Parallel and Distributed Simulation, Jan. 1992; INSPEC abstract AN 4624789.

D. M. Nicol, et al. "Optimistic parallel simulation of continuous time Markov chains using uniformization", IN *J. Parallel Distrib. Comput.* vol. 18, No. 4, Aug. 1993, pp. 395–410; INSPEC abstract AN 4505125.

S. G. Kelly, et al. "Computing global time using the multi–level token passing algorithm", IN Proceedings of the SCS Multiconference, vol. viii, 1910, pp. 63–68; INSPEC abstract AN 4358400.

R.E. Felderman, et al. "Bounds and approximations for self–initiating distributed simulation without lookahead," IN *ACM Trans. Model. Comput. Simul.,* vol. 1, No. 4, Oct. 1991, pp. 386–406; INSPEC abstract AN 4273682.

S. Bellenot, et al. "Global virtual time algorithms," IN Distributed Simulation Proceedings of the SCS Multiconference, San Diego, CA, vol. IX, 1990, pp. 122–127; INSPEC abstract AN C90052541.

P. Tinker, et al. "Task scheduling for general rollback computing," IN Proceedings of the 1989 Int'l Conf. on Parallel Processing, Penn State Univ. Press, vol. 2, 1989, pp. 180–183; INSPEC abstract AN C90014526.

I.F. Akyildiz, et al. "The effect of memory capacity on time warp performance," IN *J. Parallel Distrib. Comput.,* vol. 18, No. 4, Aug. 1993, pp. 411–422; INSPEC abstract AN 4505126.

I.F. Akyildiz, et al. "Performance analysis of 'Time Warp' with limited memory," IN *Perform. Eval. Rev.,* 1992, vol. 20, No. 1, Spec. Issue, Jun. 1992, pp. 213–224; INSPECT abstract AN 4213121.

By R. Baldwin et al., "Overlapping Window Algorithm for Computing GVT in Time Warp", IEEE, Distributed Computing Systems, 1991 International Conf., Jul. 1991, pp. 534–541.

By J. Steinman et al., "Global Virtual Time and Distributed Synchronization", IEEE, Parallel and Distributed Simulation, 1995 Workshop, Mar. 1995, pp. 139–148.

By Z. Xiao et al., "A Fast Asynchronous GVT Algorithm for Shared Memory Multiprocessor Architectures", IEEE, Parallel and Distributed Simulation, 1995 Workshop, Mar. 1995, pp. 203–208.

By B. Bayerdorffer, "Broadcast Time Warp", IEEE Proceedings of the 28th Annual Hawaii Int'l Conf. On System Sciences, 1995, pp. 602–611.

ly sent
IN-TRANSIT MESSAGE DETECTION FOR GLOBAL VIRTUAL TIME CALCULATION IN PARRALLEL TIME WARP SIMULATION

CROSS-REFERENCES TO RELATED APPLICATIONS

U.S. patent application Ser. No. 08/816,579 filed Mar. 13, 1997 is assigned to the same assignee hereof and contains subject matter related, in certain respect, to the subject matter of the present application, and is incorporated herein by reference. U.S. Pat. No. 5,442,772 entitled "Common Breakpoint In Virtual Time Logic Simulation for Parallel Processors" also describes several terms and concepts useful in understanding the present invention, and is incorporated herein by reference.

BACKGROUND OF THE INVENTION

1. Technical Field of the Invention

This invention relates to a method and apparatus for parallel simulation of integrated circuits. More particularly, it relates to the use of a global virtual time in the simulation for garbage collection.

2. Background Art

Previously known logic simulators assist in the design, development and debugging of complex circuitry. For example, the logic simulator may determine if a proposed circuit design performs the requisite function and meets other specifications before the circuitry is built. The simulator can simulate digital logic and even analog circuitry. Each logic simulator comprises one or more computer programs and data structures to simulate the circuitry. For each logic component, such as an AND gate, the logic simulator program includes a subroutine which performs a logical AND operation and maintains a data structure which stores the inputs and resultant outputs. The computer program can also supply some or all of the digital input signals to the simulated circuit, to initiate operation of the simulated circuit. The digital input signals simulate electronic signals that would be supplied by other circuitry or programming associated with the simulated circuit.

In time-warp parallel simulation, processor nodes communicate with each other by sending messages. Jefferson describes the use, for garbage collection, of periodically calculating the global virtual time (GVT) of the simulation. See D. R. Jefferson, "Virtual time," in *ACM Transactions on Programming Languages and Systems*, pp. 404–425, July 1985. Garbage collection refers to the reclaiming of storage used for executed messages with time stamp earlier than GVT. GVT at real time t is the minimum of all local clocks at real time t, and of the timestamps of all transient messages at real time t. Thus, the calculation of GVT requires the calculation of the least time-stamp of all in-transit messages.

Lin and Lazowska describe a method for determining the in-transit message with the least time stamp of two communicating processes. See Y. B. Lin and E. D. Lazowska, "Determining the global virtual time in a distributed simulation," in *Proc. International Conference on Parallel Processing*, pp. 201–209, 1990. Each message that is sent from one process to another is labeled with a sequence number and a time stamp, where the time stamp indicates the simulation time of the event in the message. In accordance with the system and method described by Lin and Lazowska, supra, an output trail buffer (OTB) on the sending process, and an input trail buffer (ITB) on the receiving process is used to record these sequence numbers and time stamps of messages. The ITB records the sequence number and time stamp of the most recently received message. The OTB contains a list of all "valley" messages that have been sent, where a valley message is defined as a message with a time stamp that is less than the time stamp of the previously sent message. During the GVT calculation each ITB sends the last received time stamp and sequence number to its corresponding OTB. The OTB then compares this information against its valley messages and determines the in-transit message with the least time stamp.

The time and complexity of this method grows as a function of $O(p^2)$, where p is the number of simulation processes. ("O" is the "order" or "Big O" notation used by computer scientists. It is a way to measure relative performance between algorithms. $O(p^2)$ means that, if the execution time equation for the algorithm were completely determined, the largest power component would be "$p^2$", so this would dominate the equation result, in this case execution time.) This method is, therefore, effective when only a few processes reside on each processor and the total number of processes is relatively close to the number of processors in the simulation.

In VHDL, however, a large number of simulation processes can occur on a single processor, and the in-transit message detection method incurs a high computational and memory cost. (VHDL refers to the VHSIC Hardware Description Language of IEEE standard 1076, where VHSIC means "very high speed integrated circuit.")

In accordance with one approach for avoiding the complexity of the method presented by Lin and Lazowska, one OTB-ITB pair is assigned per processor pair. In the worst case scenario, every processor communicates with all other processors and the number of OTB-ITB pairs is $n^2$, where n is the number of processors. The number of messages required for determining all in-transit messages is equal to the number of ITBs and is, therefore, also bounded by $n^2$. Since one OTB-ITB pair is assigned to each processor pair, multiple processes on a processor will send messages through one OTB-ITB pair. This creates what is referred to as the "false-valley" problem. Each process on a processor maintains its own local simulation time. If two processes alternately send messages through one OTB, it will appear to that OTB that every other message is a valley, since it is sent by different processors with a different local time. The false-valley problem drastically increases the length of the valley list in an OTB thereby increasing the memory and processing requirement of the method.

The direct implementation of an in-transit message detection method assigns one OTB-ITB pair to each pair of communicating processes. This way, an OTB processes messages sent by a single simulation process and will not generate false valleys. However, the number of OTB-ITB pairs and the number of message sent during the GVT calculation are now bounded by $p^2$, where p is the number of processes in the parallel simulation. The number of simulation processes can be significantly higher than the number of processors. Since the memory and processing costs grow as $O(p^2)$, where p is the number of simulation processes, this method also incurs a high space and time penalty.

It is, therefore, an object of the invention to provide a system and a method for determining the in-transit message with the least time stamp which does not incur a high memory or computational cost.

It is also an object of the invention to provide such a system and method which further eliminates the false-valley problem.

It is a further object of the invention to provide a method for determining in-transit messages that eliminate the false-valley problem and requires at most $n^2$ messages, where n is the number of processors.

SUMMARY OF THE INVENTION

In accordance with the invention, a system and method for determining global virtual time is provided for use in controlling computer operations. Processes executing on parallel processors communicate messages through channels having output trail buffers on each process communicating to the channel, and one input trail buffer for all processes receiving messages from the channel. A channel is the union of all wires or communication paths connecting two processors. Input trail buffers store the time stamp of the most recently received message, and output trail buffers store valley messages. Global virtual time is calculated with reference to the least time stamp of the output trail buffers, where the least time stamp is calculated with respect to the time stamp of the input trail buffer.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
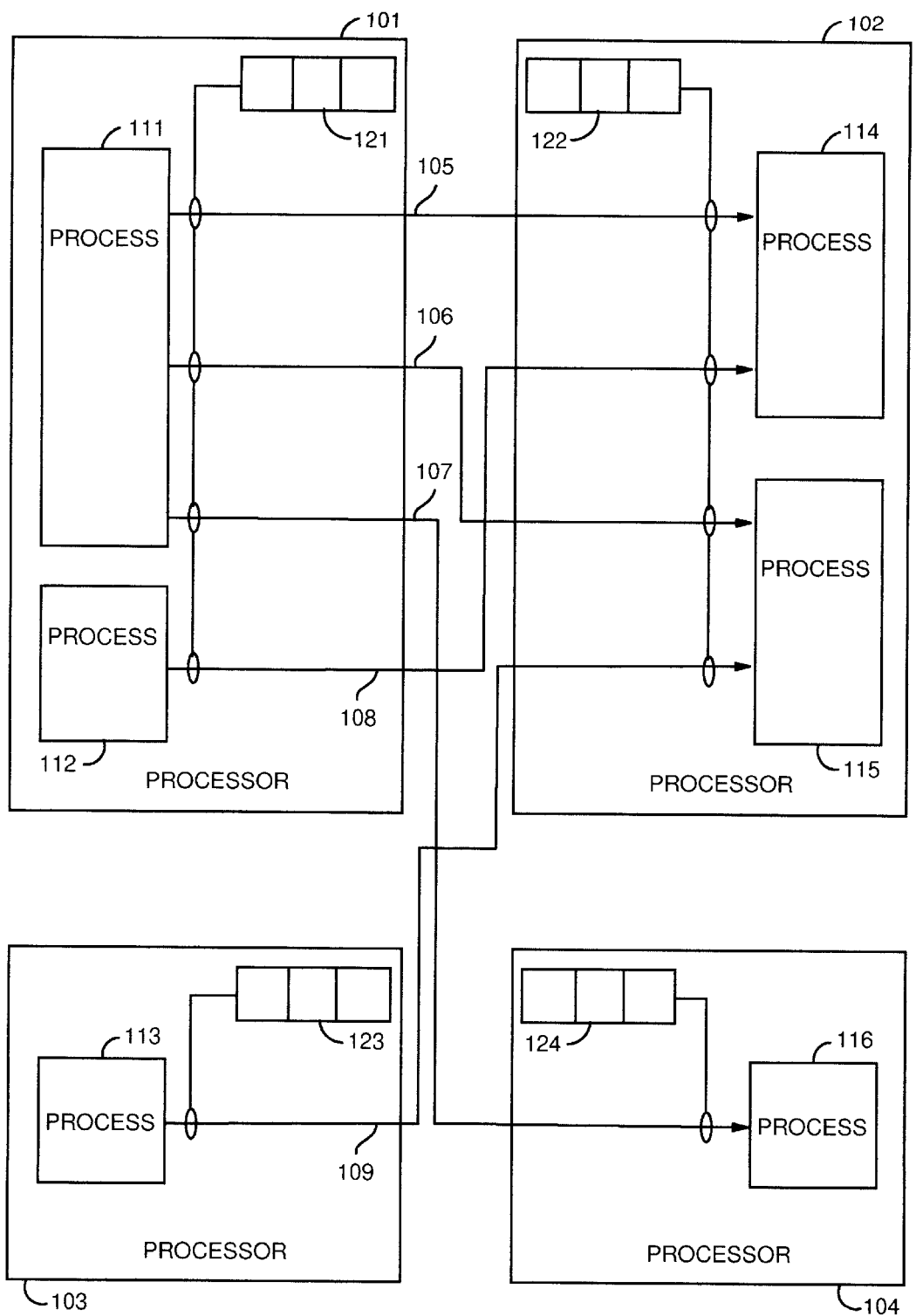
FIG. 1 illustrates a diagrammatic view of OTB-ITB assignment per processor pair in accordance with the prior art giving rise to the false valley problem.

Referring to FIG. 1, in accordance with one approach for avoiding the complexity of the method presented by Lin and Lazowska, one OTB-ITB pair is assigned per processor pair.

Figure 2:
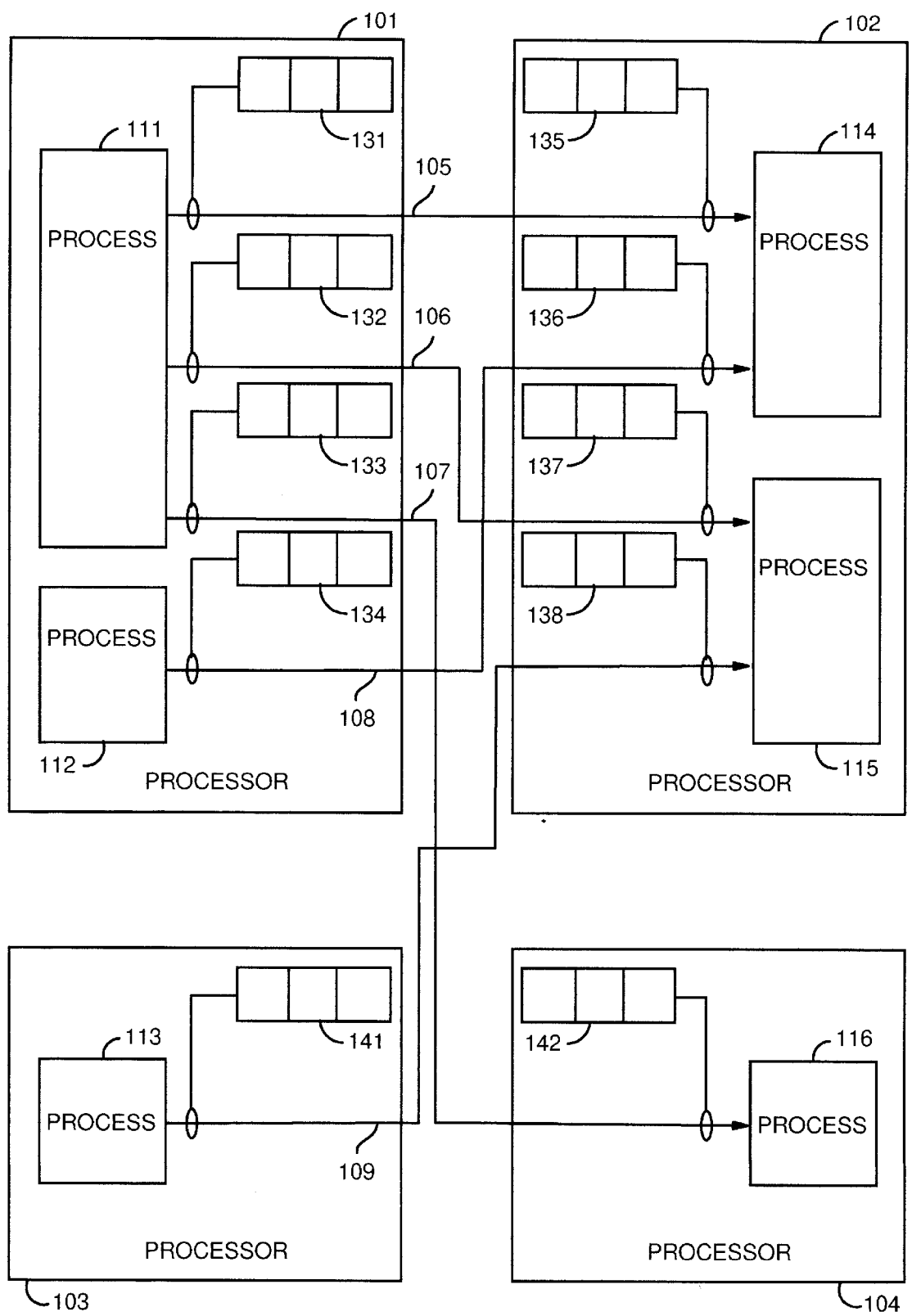
FIG. 2 illustrates in a diagrammatic view the assignment of an OTB-ITB pair per process, giving rise to the false valley problem.
Figure 3:
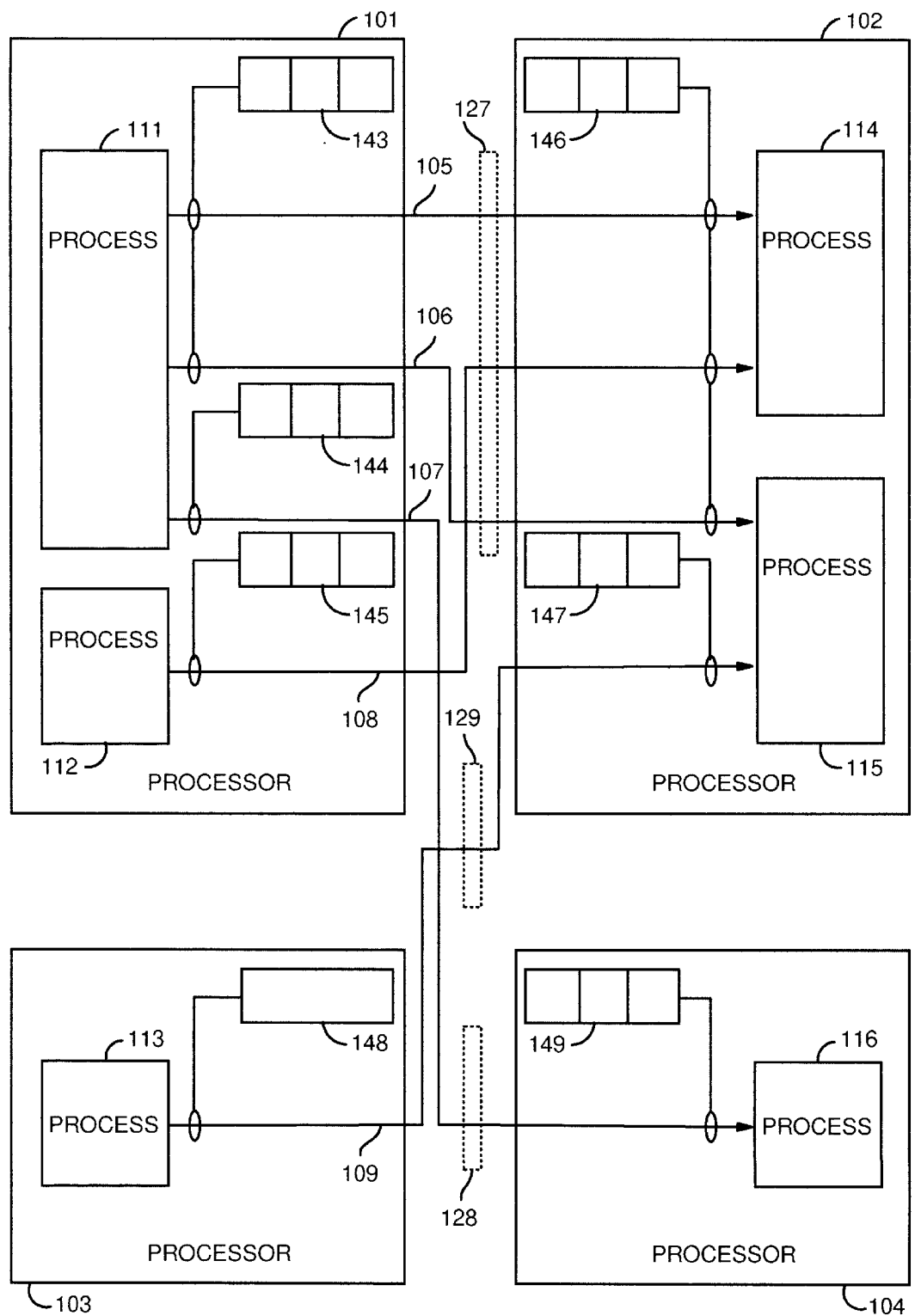
FIG. 3 illustrates in a diagrammatic view the assignment of an OTB-ITB pair per channel, in accordance with the invention.

In each of FIGS. 1–3, processor 101 simulates processes 111 and 112, processor 102 simulates processes 114 and 115, processor 103 simulates process 113 and processor 104 simulates 116. Processes communicate with each other with messages, directed as is represented by line 105 from process 111 to process 114, by line 106 from process 111 to process 115, by line 107 from process 111 to process 116, by line 108 from process 112 to process 114, and by line 109 from process 113 to process 115. Each message sent from one process 111–113 to another process 114–116 is labeled with a sequence number and a time stamp, where the time stamp indicates the simulation time of the event in the message.

FIGS. 1–3 differ in the configuration of the output trail buffer (OTB) and input trail buffer (ITB) pairs. In FIG. 1, there is one OTB per sending processor and one ITB per receiving processor; in FIG. 2, there is one OTB/ITB pair per communicating process pair, and in FIG. 3 there is one ITB per channel, with an OTB for each sending process connected to the channel.

An OTB records the sequence number and time stamps of messages sent from a process, and an ITB records the sequence number and time stamps of messages received by a process.

Thus, in the prior art configuration of FIG. 1, OTB 121 records sequence numbers and time stamps of messages sent from processes 111 and 112, and OTB 123 records sequence numbers and time stamps of messages sent from process 113. ITB 122 records sequence numbers and time stamps received by processes 114 and 115, and ITB 124 records sequence numbers and time stamps received by process 116.

As illustrated in FIG. 1, in the worst case scenario, every sending processor 101, 103 communicates with all receiving processors 102, 104 and the number of OTB-ITB pairs is $n^2$, where n is the number of processors.

The number of messages required for determining all in-transit messages is equal to the number of ITBs and is, therefore, also bounded by $n^2$. Since one OTB-ITB pair is assigned to each processor pair, multiple processes on a processor will send messages through one OTB-ITB pair. This creates what is referred to as the "false-valley" problem. Each process on a processor maintains its own local simulation time. If two processes alternately send messages through one OTB, it will appear to that OTB that every other message is a valley, since it is sent by different processors with a different local time. The false-valley problem drastically increases the length of the valley list in an OTB thereby increasing the memory and processing requirement of the method.

Referring to FIG. 2, the direct implementation of an in-transit message detection method assigns one OTB-ITB pair to each pair of communicating processes.

Thus, in the configuration of FIG. 2, with one OTB/ITB pair per sending/receiving process pair, OTB 131/ITB 135 record sequence numbers and time stamps (hereafter referred to as message data) sent and received, respectively, by process 111 to process 114. Similarly, OTB/ITB pair 132, 137 records message data from process 111 to process 115, OTB/ITB pair 133, 142 records message data from process 111 to process 116, OTB/ITB pair 134, 136 records message data from process 112 to process 114, and OTB/ITB pair 141, 138 records message data from process 113 to process 115.

In the approach illustrated in FIG. 2, an OTB processes messages sent by a single simulation process and will not generate false valleys. However, the number of OTB-ITB pairs and the number of message sent during the GVT calculation are now bounded by $p^2$ where p is the number of processes in the parallel simulation. The number of simulation processes 111–116 can be significantly higher than the number of processors 101–104. Since the memory and processing costs grow as $O(p^2)$ where p is the number of simulation processes 111–116, this method also incurs a high space and time penalty.

Referring to FIG. 3, in accordance with this invention, a method is described for determining in-transit messages that eliminates the false-valley problem and requires only $n^2$ messages for GVT computation, where n is the number of processors.

In FIG. 3, OTB 143 records message data from process 111 to processes 114 and 115, OTB 144 records message data from process 111 to process 116, OTB 145 records message data from process 112 to process 114, and OTB 148 records message data from process 113 to process 115.

Further, ITB 146 records message data received at process on processor 102 from processes on processor 101, ITB 147 records message data received at processes on processor 102 from processes on processor 103, and ITB 149 records message data received at processes on processor 104 from processes on processor 101.

In accordance with FIG. 3, a channel is the union of all wires or communication paths 105–109 connecting two processors 101–104. Since each processor contains multiple simulation processes, a channel can contain the wires of multiple processes. Thus, in FIG. 3, channel 127 contains wires from process 111 and 112 on processor 101 to processes 114 and 115 processor 102. For each channel 127–128, one OTB 143–145, 148 is assigned for each process 111–113 connected to the channel 127–128 on the sending processor 101, 103. However, only one ITB 146–147, 149 is assigned for one channel on a receiving processor 102, 104. The number of ITBs is equal to the number of channels in the parallel simulation which has an upper bound of $n^2$, where n is the number of processors. Since each ITB sends one message during the GVT calculation, the total number of messages needed for the GVT calculation is, therefore, also bounded by $n^2$. On the sending side of a channel, one OTB 143–145, 148 is assigned to each process 111–113 communicating through the channel 127–129. The number of OTBs is, therefore, bounded by (p)(n), where p is the number of processes and n is the number of processor nodes. Since all time stamps observed by an OTB are generated by a single simulation process, no false valleys will occur in the OTB. Furthermore, messages sent by all processes through a channel are labeled with a single sequence number generator. Consecutive messages sent through the channel therefore have consecutive sequence numbers, even if the messages were generated by different simulation processes. During the GVT calculation, one sequence number and one time stamp is sent back by each ITB. This information is then compared by each OTB associated with the channel against its valley sequence numbers. The least time stamp detected by each OTB are then minimized to produce the final least time stamp of all in-transit messages on the channel.

Figure 4:
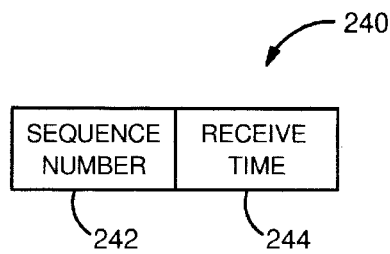
FIG. 4 illustrates the format of an OTB element.

Referring to FIG. 4, an OTB element 240 represents a valley. Each valley representation includes a sequence number 242 and receive time 244 pair.

In Table 1, the procedure for setting up an OTB is described. In Table 2, the procedure for setting up an ITB is described. In Table 3, the procedure for calculating global virtual time (GVT) is described.

Figure 5:
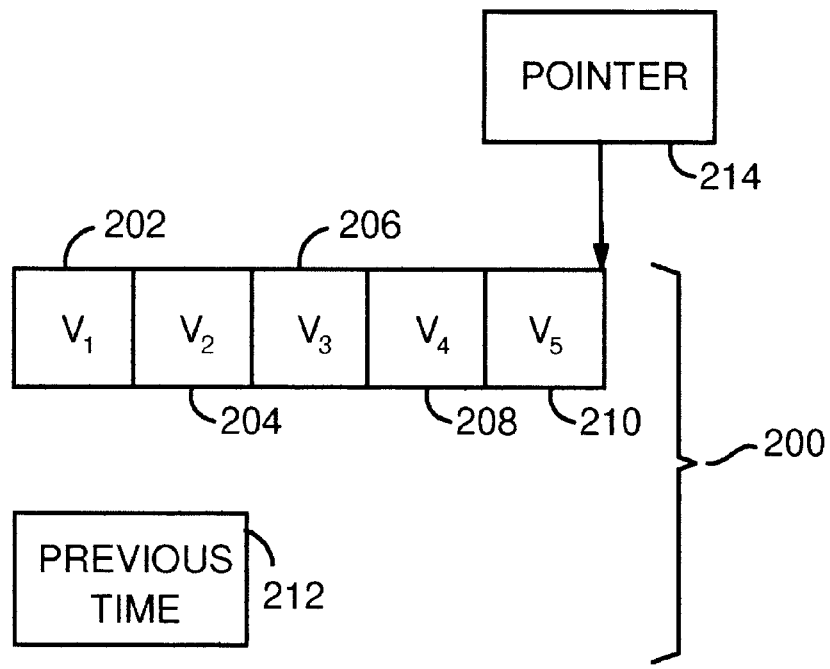
FIG. 5 illustrates the data structure of the OTB.

Referring to FIG. 5 in connection with Table 1, the structure of an OTB 200 includes a plurality of valley elements 240, including valley elements V1 202, V2 204, V3 206, V4 208 and V5 210. Previous time is stored in field 212, and pointer 214 points to the last entry in OTB 200.

Figure 6:
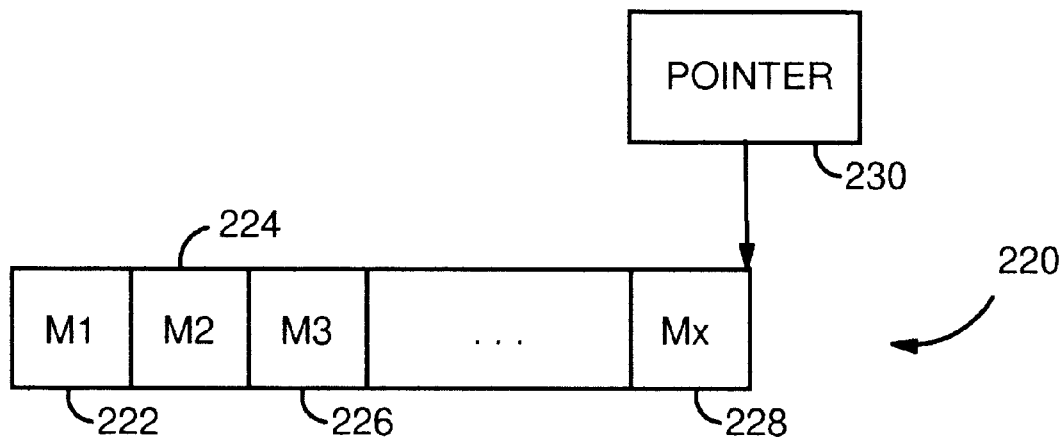
FIG. 6 illustrates the data structure of the ITB.

Referring to FIG. 6 in connection with Table 2, ITB 220 is set up and maintained upon message reception, and includes received messages M1 222, M2 224, M3 226, . . . , Mx 228. Pointer 230 points to the last entry in ITB 220. The procedure in Table 2 could be compressed to storing received sequences (for non-ordered message reception) or a single number (for ordered messages.)

Figure 7:
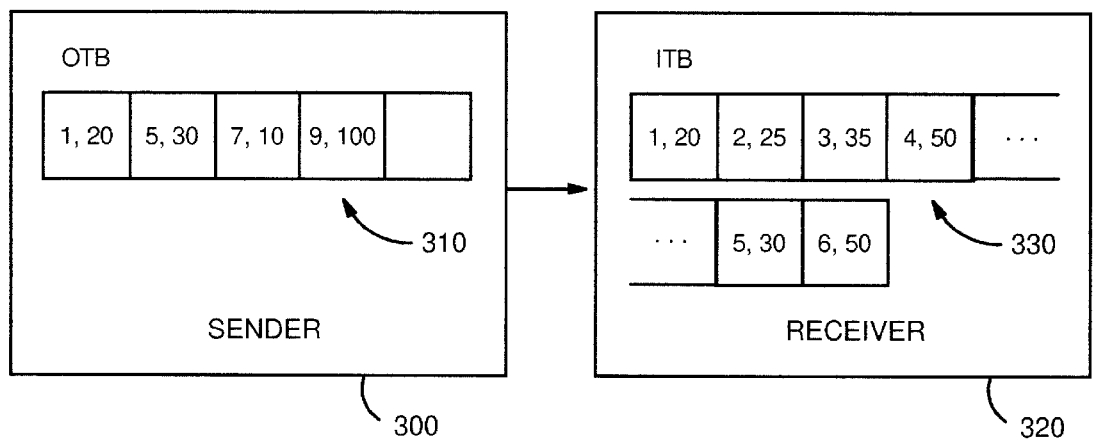
FIG. 7 illustrates an exemplary OTB/ITB pair for use in explaining GVT computation.

Referring to FIG. 7 in connection with Table 3, an example is provided of OTB 310 at sender processor node 300, and of ITB 330 at receiver processor node 320. If GVT is requested with the state set forth in FIG. 7, the procedure set forth in Table 3 would yield the following:

1. Receiver 320 sends message 6,50 to sender 300.
2. Sender executes code in Table 3 with initial values:
   RECEIVER.SN=6
   RECEIVER.TIME=50.
3. Initial values are compared with 9,100 and 7,10.
4. Final results
   RECEIVER.TIME=10
   GVT=MIN {LVT, 10}
     where 10 represents the minimum time of messages in transit.

Local virtual time (LVT) is the time a processor thinks the simulation is at based on the last model evaluation which was performed, and can be different for each processor.

TABLE 1

Setting Up OTB

THIS MESSAGE.SEQ# = LAST SEQ# + 1
IF   THIS MESSAGE.TIME < PREVIOUS TIME
     THEN STORE AS VALLEY IN OTB
ENDIF
PREVIOUS TIME = THIS MESSAGE.TIME

TABLE 2

Setting Up ITB

UPON RECEPTION OF MESSAGE
SN = SN + 1
STORE SN ON ITB

TABLE 3

GVT Computation

IF   I'M A RECEIVER OF MESSAGES {
     SEND LAST IMB ENTRY TO SENDER,
     INCLUDING  LAST SN RECEIVED
                RECEIVER'S LOCAL TIME
                PROCESS IDENTIFIER
}
IF   I'M A SENDER OF MESSAGES {
     READ ALL MESSAGES FROM RECEIVERS
     FIND THE MINIMUM TIME OF ALL MESSAGES FROM
        RECEIVERS
     RECEIVER.SN = SN FROM MINIMUM MESSAGE
     RECEIVER.TIME = TIME FROM MINIMUM MESSAGE
     WHILE   OTB.SN > RECEIVER.SN
        IF      OTB.TIME < RECEIVER.TIME
                RECEIVER.TIME = OTB.TIME
        ENDIF
     ENDWHILE
     GVT = MIN { LVT, RECEIVER.TIME }
     RECLAIM BUFFERS IN ITB, OTB
}

The method of this invention may be executed on any of a number of parallel platforms, such as clustered IBM RS/6000 systems 101–104.

Advantages Over the Prior Art

This invention presents a method for determining in-transit messages for parallel time warp simulation which efficiently handles large numbers of simulation processes per processor node. It uses one ITB per channel and one OTB per dispatcher per channel. All messages sent through one channel are also labeled with one sequence number generator. In this manner, the system and method of the invention require at most $n^2$ messages during the GVT calculation, where n is the number of processors, and eliminate the false-valley problem encountered by other approaches.

Alternative Embodiments

It will be appreciated that, although specific embodiments of the invention have been described herein for purposes of illustration, various modifications may be made without departing from the spirit and scope of the invention. In particular, it is within the scope of the invention to provide a memory device, such as a transmission medium, magnetic or optical tape or disc, or the like, for storing signals for controlling the operation of a cluster of computers according to the method of the invention and/or to structure its components in accordance with the system of the invention.

Accordingly, the scope of protection of this invention is limited only by the following claims and their equivalents.

We claim:

1. System for parallel simulation of integrated circuits, comprising:

a plurality of simulation processes, including at least one sending process and one receiving process;

a plurality of processors, including at least one sending processor and at least one receiving processor, for executing said simulation processes;

at least one communication channel, each said channel comprising the union of all communication paths connecting a sending processor to a receiving processor;

a plurality of output trail buffers, each said output trail buffer storing valley message data communicated from a sending process for global virtual time computation, with one output trail buffer assigned for each process on a sending processor connected to said communication channel; and a plurality of input trail buffers, each said input trail buffer storing the most recently received message data communicated to a receiving process, with one input trail buffer assigned on a receiving processor for each said communication channel.

2. Method for managing storage used for simulation, comprising the steps of:

recording in an input trail buffer the most recently received message data received on a communication channel at a receiving processor, said channel comprising the union of all communication paths connecting a sending processor to a receiving processor;

recording in a plurality of output trail buffers valley message data sent from sending processes to said channel;

responsive to message data from an input trail buffer, determining the least time stamp at each said output trail buffers;

minimizing the collection of least time stamps to determine the final least time stamp of all in-transit messages on said channel;

responsive to said final least time stamp, calculating global virtual time; and reclaiming storage used for executed messages with time stamp earlier than global virtual time.

3. A memory device for storing signals for controlling the operation of a cluster of computers according to the method of recording in an input trail buffer the most recently received message data received on a communication channel at a receiving processor, said channel comprising the union of all communication paths connecting a sending processor to a receiving processor;

recording in a plurality of output trail buffers valley message data sent from sending processes to said channel;

responsive to message data from an input trail buffer, determining the least time stamp at each said output trail buffers;

minimizing the collection of least time stamps to determine the final least time stamp of all in-transit messages on said channel;

responsive to said final least time stamp, calculating global virtual time; and reclaiming storage used for executed messages with time stamp earlier than global virtual time.

4. Method for operating a computing system to manage storage resources, comprising the steps of:

operating at least one receiver of messages on a channel to send a last input message buffer entry to a sender on said channel, said channel comprising the union of all communication paths connecting a sending processor to a receiving processor, said entry including the sequence number of the last message received, the local time, and an identifier of a process;

operating a sender of messages on said channel to find the minimum time and corresponding sequence number in all messages from receivers of messages; determine from its output trail buffer the earliest entry for which a sequence number is greater than the sequence number received from the receiver of messages and the time is less than the time received from the receiver of messages, said earliest entry representing a receiver time; determine the global virtual time as the minimum of said receiver time and local virtual time; and reclaiming ITB and OTB buffer storage resources for messages having a time before said global virtual time.

* * * * *